_(12)_ United States Patent
Ho et al.

(10) Patent No.: US 6,808,957 B1
(45) Date of Patent: Oct. 26, 2004

(54) METHOD FOR IMPROVING A HIGH-SPEED EDGE-COUPLED PHOTODETECTOR

(75) Inventors: Chong-Long Ho, Taoyuan (TW); Gong-Cheng Lin, Taoyuan (TW); I-Ming Liu, Taoyuan (TW); Chia-Ju Lin, Taoyuan (TW); Yao-Shing Chen, Taoyuan (TW); Wen-Jeng Ho, Taoyuan (TW); Jy-Wang Liaw, Taoyuan (TW)

(73) Assignee: Chunghwa Telecom Co., Ltd., Taoyuan (TW)

( * ) Notice: Subject to any disclaimer, the term of this patent is extended or adjusted under 35 U.S.C. 154(b) by 0 days.

(21) Appl. No.: 10/630,935

(22) Filed: Jul. 31, 2003

(51) Int. Cl.$^7$ .............................................. H01L 21/00
(52) U.S. Cl. ........................................ 438/57; 438/962
(58) Field of Search .............................. 438/57, 72, 81, 438/636, 962; 257/184, 436, 464, 465

(56) References Cited

U.S. PATENT DOCUMENTS

| | | | |
|---|---|---|---|
| 4,835,575 A | 5/1989 | Plihal | |
| 5,285,514 A | 2/1994 | Nojiri et al. | |
| 5,521,994 A | 5/1996 | Takeuchi et al. | |
| 5,991,473 A | 11/1999 | Nishikata et al. | |
| 5,998,851 A | 12/1999 | Nishikata | |
| 6,498,337 B2 | 12/2002 | Yasuoka | |
| 6,525,347 B2 * | 2/2003 | Matsuda | 257/184 |

* cited by examiner

Primary Examiner—Kamand Cuneo
Assistant Examiner—Lisa Kilday
(74) *Attorney, Agent, or Firm*—Rabin & Berdo, P.C.

(57) ABSTRACT

An edge-coupled photodetector, especially a compound semiconductor edge-coupled photodetectors, has a light funnel integrated right in front of the coupling aperture for enhancing the optical coupling efficiency. The light funnel is formed utilizing either a wet etched, crystallographically defined semiconductor slope or a dry etched, resist-profile-defined semiconductor slope covered by the planarized dielectrics. The funnel internals can be partially or fully metallized for total mirror reflection. The lightwave entering the funnel and propagating along the optical axis converges through mirror reflection or total internal reflection. Through such an invention, the edge-coupled photodetector can have both high operation speed and high quantum efficiency with enlarged alignment tolerance.

11 Claims, 11 Drawing Sheets

METHOD FOR IMPROVING A HIGH-SPEED EDGE-COUPLED PHOTODETECTOR

BACKGROUND OF THE INVENTION

1. Field of the Invention

The present invention relates to a method for improving the optical coupling of the edge-coupled photodetector, especially a high-speed semiconductor edge coupled photodetectors which usually have a coupling aperture much smaller than the output spot-size (mode-field diameter) of the coupler.

2. Description of the Prior Art

Semiconductor photodetectors are indispensable in fiberoptic communications for receiving transmitted information and, as required data capacity increases, it is essential for the detectors to achieve high-speed data operation with high receiving efficiency. As shown in FIG. 1(a), a conventional semiconductor photodetector has a layer structure wherein P+ type and N+ type semiconductor layers (111 and 113) sandwich therebetween a low- or un-doped optical absorption layer 112. This photodetector is generally applied with a reverse bias between the P+ and N+-type semiconductor layers to deplete the optical absorption layer of carriers, and uses the high electric field generated in the depleted region to collect the photo-generated carriers.

Conventional surface-coupled photodetectors, which receive the incoming light 114 from the top of the device, have their optical absorption path parallel to and overlapping with carrier transit path. Reduction of the carrier transit path, though enhances the operating speed (if the detector bandwidth is transit-time-limited), results in lower absorption efficiency and thus degrades detector sensitivity. In other words, the surface-coupled photodetectors can not have the maximum bandwidth and maximum quantum efficiency simultaneously. More specifically, there exists a maximum value for the bandwidth-efficiency product of surface-coupled photodetectors. For instance, 30 GHz is a typical bandwidth-efficiency product value for InP-based long-wavelength surface-coupled photodetectors.

On the other hand, the edge-coupled photodetectors, which receive the incoming light 115 from the edge of the device, have their optical absorption path $\Delta Z$ and carrier transit path $\Delta X$ perpendicular to each other, therefore the two path lengths can be independently tuned. Ideally, the edge-coupled photodetectors can have their highest bandwidth along with the highest quantum efficiency. However, in practical case, as the absorption layer thickness $\Delta X$ decreases for shortening the carrier transit time, the optical coupling using conventional waveguide device, such as the optical fiber, gets harder since the epi-structure-defined coupling aperture shrinks accordingly. For instance, $\Delta X$ must be smaller than 1 $\mu$M for 30 GHz detector bandwidth, while typically the single-mode fiber has a beam diameter larger than 5 $\mu$m. It is therefore more difficult to adapt the coupling aperture of the photodetector to the mode field diameter of an optical fiber, thereby causing a problem of coupling loss therebetween.

As shown in FIG. 1(a), the coupling aperture of edge-coupled photodetectors locates at the edge side of the device; therefore its effective size is determined by the cross section of the semiconductor layer structure and can be approximately represented by $\Delta X \Delta Y$ Using an optical fiber as a coupler for direct coupling the light 115 into the effective aperture of a high-speed photodetector for optical absorption in the thin absorption layer 112, one can achieve the high coupling efficiency only if the optical spot size is adequately small and the optical alignment, especially in the direction perpendicular to the device substrate, is accurate. For this coupling issue, a photodetector with a waveguide structure, which enlarges the effective coupling aperture, has been disclosed both in U.S. Pat. No. 5,991,473 and 5,998,851, and is schematically shown in FIG. 1(b). Through this waveguide-forming layer structure, the effective coupling aperture (mode-field diameter) can be increased approximately from, for example, 0.41 $\mu$m to 3 $\mu$m, and thus the detector efficiency can be significantly promoted. However, the total layer thickness of the epi-structure is typically larger than 7 $\mu$m, which requires the epitaxial growth time at least double than the conventional detector structure (FIG. 1(a)) for additional thick cladding layers 114 and 115. The photodetector with tapered absorption layer proposed in U.S. Pat. No. 5,998,851 even requires a re-growth process, which introduces almost doubled epitaxy cost, and reproducibility and reliability issues. These additional cost and issues also happen in the waveguide-integrated photodetectors disclosed in U.S. Pat. Nos. 4,835,575, 5,285,514, 5,521, 994, and 6,498,337. Besides, in addition to direct coupling, these waveguide-type or waveguide-integrated photodetector utilizes indirect evanescent coupling, which requires at least 20–30 $\mu$m detector length for the propagating light to be absorbed and therefore inevitably introduces additional junction capacitance. Larger junction capacitance results in lower device bandwidth.

According to the definition of the active pn junction region, the edge-coupled photodetectors can be divided into two categories: junction-mesa type as shown in FIG. 1(a) and selective-area-diffused (SAD) mesa type as shown in FIG. 1(c). The junction mesa type has a pn junction formed during the layer epitaxy and has a junction area defined by photolithography and etching process. The SAD-mesa type has a pn junction formed by localized diffusion process, which in the meantime defines the junction area. Due to that the depleted absorption region is sealed inside, the SAD-mesa type photodetector is generally considered more reliable than the junction-mesa type photodetector. Let us consider an exclusive problem encountered by the SAD-mesa type photodetector. As shown in FIG. 1(c), the photodetector is composed by a highly n-type doped wide-bandgap semiconductor layer 113, a low- or un-doped narrow-bandgap semiconductor absorption layer 112, and a highly p-type doped wide-bandgap semiconductor region 111a, which defines the active region of the photodetector and is formed by the diffusion process, surrounded by a low- or un-doped wide-bandgap semiconductor region 111b. The low- or un-doped region 111c with an appropriate width $\Delta t$ left in front of the active region effectively protects the active region from the outer environment. The regions outside the borders defined by the diffusion area with $\Delta t$ outward extensions (i.e., the border defined by the thick dash lines) are out of the reach of the biasing field, and therefore are regarded as the inactive regions. Such regions exist exclusively only in the SAD-mesa type photodetectors. During optical coupling, the misalignment results in the coupling loss, which is no exception to the junction-mesa type photodetectors. However, besides coupling loss, lateral misalignment in Y direction can result in optical absorption in the inactive absorption regions of the SAD-mesa type photodetectors. Those photons being absorbed give up the energy which excite the electrons in the valence band and consequently generate electron/hole pairs. The electron/hole pairs generated in the inactive absorption regions either recombine in a short periods of time or slowly diffuse into the biased active region, at which they are then accelerated by the biasing field toward the respective electrodes. These "slow" carriers, relative to the "fast" carriers generated and drifting in the biased active region, result in signal tailing and deteriorate the device bandwidth. In summary, besides the coupling loss, there exist other issues relating to the misalignment, such as bandwidth reduction and linearity degradation caused by the slow carriers.

SUMMARY OF THE INVENTION

It is an object of the present invention to provide a light funnel integrated right in front of the coupling aperture of the edge-coupled photodetector for enlarging the effective coupling aperture and thereby enhancing the optical coupling efficiency. The funnel is preferably made of dielectric materials, such as silicon dioxide or polymer, and itself provides the optical confinement in the directions perpendicular to the optical axis that is referred as the Z-direction hereinafter. In the direction perpendicular both to the optical axis and the device substrate, hereinafter referred as the X-direction, the funnel effect is realized by utilizing either a wet etched, crystallographically defined semiconductor slope or a dry etched, resist-profile-defined semiconductor slope covered first by a highly reflective metal film and then a planarized dielectric layer. The funnel width in the X-direction therefore shrinks gradually along the +Z-axis. In the direction perpendicular to the optical axis while parallel to the device substrate, hereinafter referred as the Y-direction, the funnel effect is realized by utilizing the photolithography and the etching process to define a gradually shrinking funnel width along the +Z-axis. In appearance, the funnel's top plane is essentially parallel to the device substrate, its bottom plane has an adequate included angle with the device substrate or has a tapering profile with an adequate curve function, such as parabolic taper or S-Bend cosine taper, and the two side planes perpendicular to the device substrate have adequate included angles with the optical axis or have tapering profiles with adequate curve functions, such as parabolic taper or S-Bend cosine taper. The funnel exit is just the optical entrance of the detector. The funnel internals can be partially or fully metallized for total mirror reflection. The lightwave entering the funnel converged in the X direction through the metallic mirror or total internal reflection and guided in the Y direction also through the metallic mirror or total internal reflection.

It is another object of the present invention to provide a light funnel integrated right in front of the coupling aperture of the edge-coupled photodetector for coupling the light into the active absorption region of the photodetector more uniformly and thereby reducing the input optical density. Reducing the optical density results in less carrier density that produces less space-charge effect and improves the device linearity.

It is a further object of the present invention to provide a light funnel integrated right in front of the coupling aperture of the edge-coupled photodetector. The funnel allows a larger optical spot size or a larger alignment tolerance for optical coupling. The incident lightwave is funneled into the active region without spilling into the inactive absorption region. Therefore no slow carrier generates and the device can have high quantum efficiency without sacrificing the operation bandwidth and linearity.

It is a still further object of the present invention to provide an integrated dielectric light funnel right in front of the detector's coupling facet for protecting the facet.

Besides the objects described above, the present invention also has the advantage of making a high-density edge-coupled photodetector array with relaxed alignment tolerance due to the enlarged coupling aperture. The arrayed photodetectors are particularly useful in the applications with a high data volume, such as ultrahigh-speed parallel data communication or wavelength division multiplexing (WDM) systems. Since each photodetector can achieve high-speed operation with high receiving efficiency, such array can manipulate a data volume of several tens or even several hundreds of Gigabits per second.

BRIEF DESCRIPTION OF THE DRAWINGS

The present invention and its advantages can better be understood by describing in detail, the preferred embodiments thereof with reference to the attached drawings in which.

DETAILED DESCRIPTION OF THE REFERRED EMBODIMENT

In the following, two preferred embodiments are presented in detail for this invention. In these embodiments, InP-based edge-coupled photodetectors with integrated light funnel are presented. Nevertheless, it should be emphasized that this invention is not limited to InP-based photodetectors, but is applicable to other compound semiconductor photodetectors.

In the first embodiment, the optical funneling (in the X-direction) is realized through the crystallographically defined, chemically etched InP slope covered first by a highly reflective metal film and then by a planarized dielectric film. Since the InP slope is crystallographically defined, the shape of the funnel has a high reproducibility.

Figure 1A:
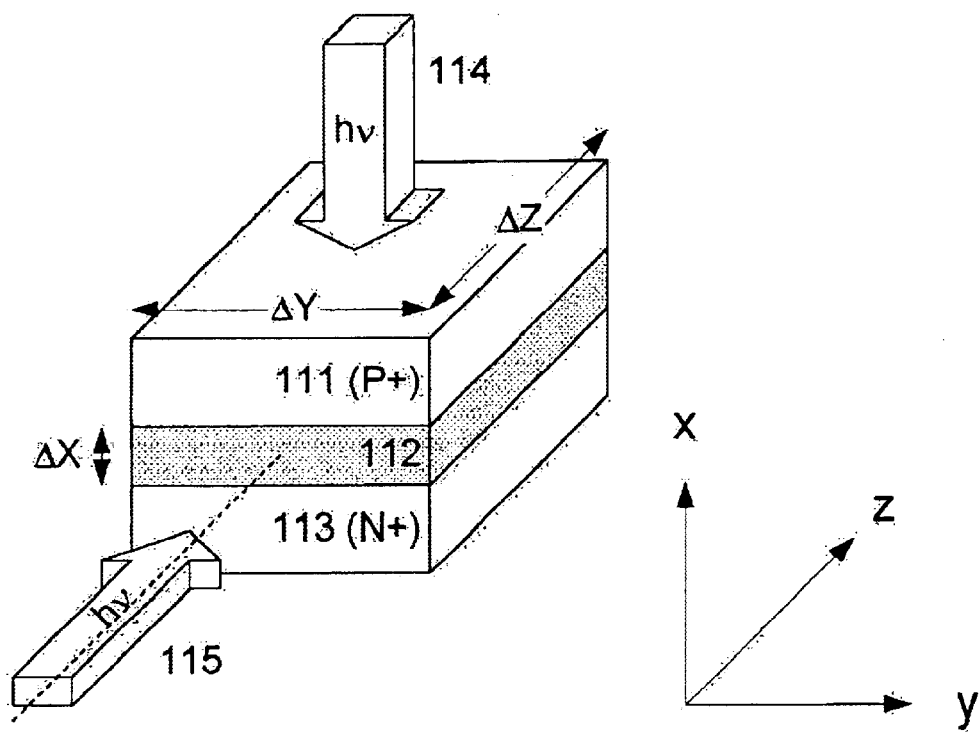
FIG. 1(a) is a schematic diagram of the junction-mesa type edge-coupled photodetector.
Figure 1B:
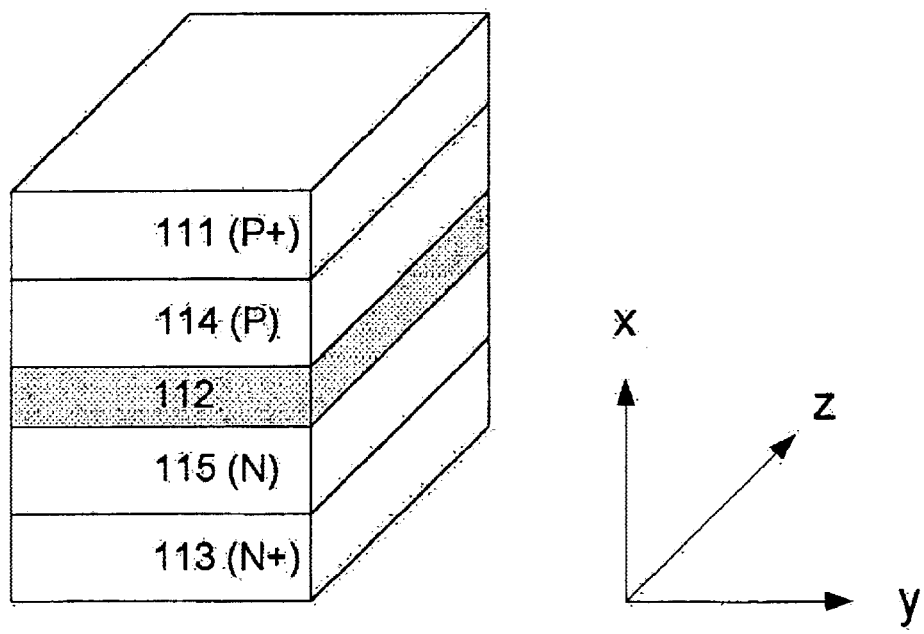
FIG. 1(b) is a schematic diagram of the waveguide photodetector.
Figure 1C:
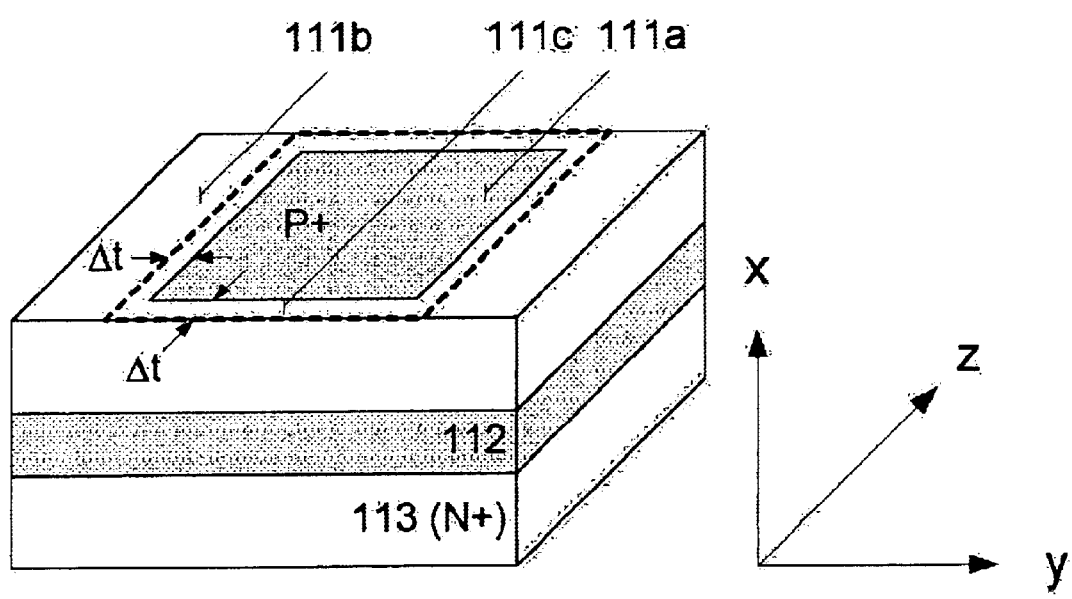
FIG. 1(c) is a schematic diagram of the selective-area-diffused-mesa type edge-coupled photodetector.
Figure 2A:
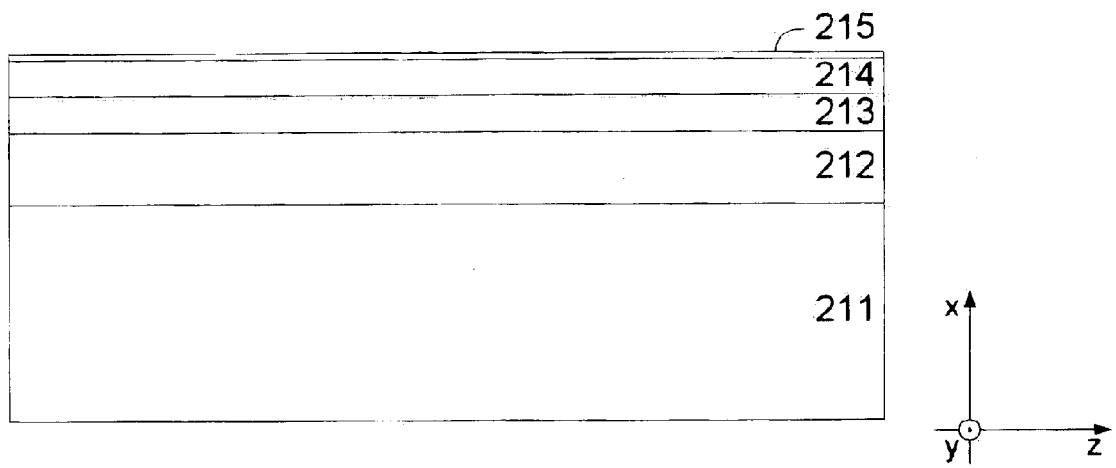
FIGS. 2(a) through 2(e) are cross-sectional views of the light-funnel-integrated edge-coupled photodetector in the process described in the first preferred embodiment of this invention.

The starting layer structure of the photodetector shown in FIG. 2(a), for example, consists of an heavily doped n-type InP substrate 211, an epitaxially grown InP layer 212, an epitaxially grown low- or un-doped InGaAsP absorption layer 213, an epitaxially grown InGaAsP cladding layer 214, and an epitaxially grown InGaAsP contact-layer 215. More specifically, the InGaAsP absorption layer 213 have the absorption cutoff wavelength ($\lambda_g$) equal to or larger than 1.3 $\mu$m, the InGaAsP cladding layer 214 have the $\lambda_g$ smaller than that of layer 213, and the InGaAsP contact layer 215 have the $\lambda_g$ equal to or larger than that of layer 214. Such layer arrangement is to avoid the absorption occurring in the thick InGaAsP cladding layer 214 and to provide a low contact resistance between the contact metallization and the contact layer 215.

Figure 2B:
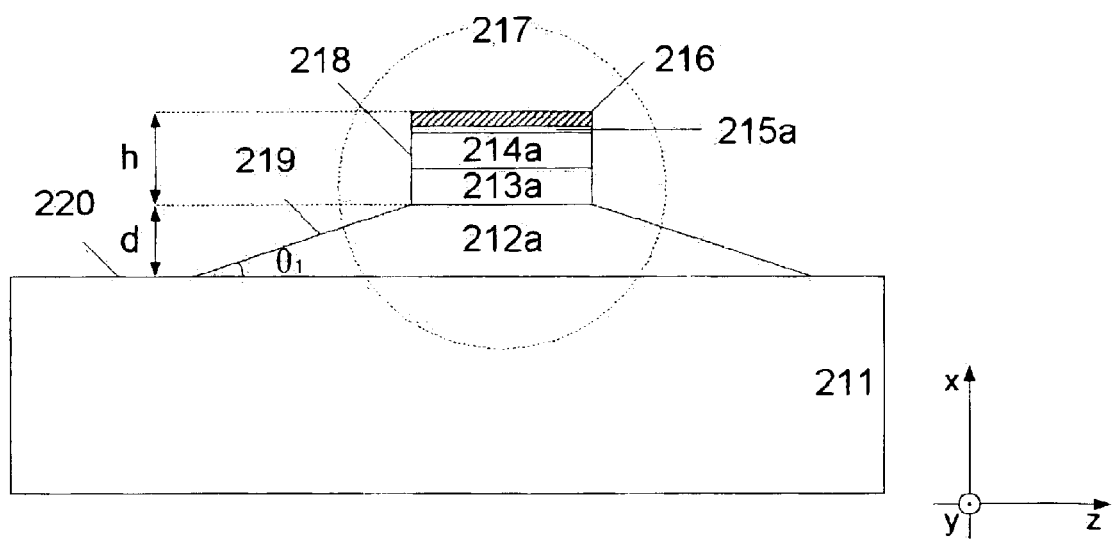

The process in this embodiment starts with the formation of the active mesa 217, as shown in the cross-sectional view of FIG. 2(b). The active mesa 217 of the photodetector can either be a junction mesa or a SAD-mesa as distinguished before. For junction mesa, the cladding layer 214 and contact layer 215 are both p-type doped during the epitaxial process. For SAD-mesa, the cladding layer 214 and contact layer 215 are both left undoped during the epitaxial process, and are selectively p-type doped through the diffusion process. The active mesa is preferably formed by the dry etch process using, for example, $CH_4H_2/O_2$ gas mixtures to achieve the vertical side walls 218 for maximum lightwave transmission. The dry etch process removes the contact layer 215, cladding-layer 214, the absorption layer 213, and proceeds until the InP layer 212 is reached. The InP layer 212 is then chemically etched using, for example, HCl-based solution and, due to the slowest etching rate in the direction normal to the (112)A crystal plane, is transformed into a sloping layer 212a with the slope angle $\theta_1$ of about 35°. The etching mask 216 for the above dry and wet etching process can either be dielectric films, such as $SiO_x$ and $SiN_x$, or contact metallizations, such as AuZn/Au with overlaid Cr or Ni hard mask. In this embodiment, the latter one is utilized.

During the dry etching process for mesa formation, though the slight over-etch into the InP layer 212 is tolerable, a 0.1–0.2 $\mu$m thickness of InGaAsP absorption layer 213 may be left for chemical etching using $H_3PO_4$:$H_2O_2$:$H_2O$ or $H_2SO_4$:$H_2O_2$:$H_2O$ solutions. Due to high etching selectivity, the chemical etching removes the last 0.1–0.2 $\mu$m InGaAsP absorption layer and almost halts once the InP layer 212 is reached, therefore prevents the InP layer 212 from over-etching.

It should be mentioned that, during InP slope etching, it is rather difficult to exactly control the slope height "d" and to obtain a flat and smooth bottom surface 220 due to the reaction-limited etching process and the homo-interface between InP layer 212 and InP substrate 211. Therefore a thin InGaAsP ($\lambda_g \geq 1.2$ $\mu$m) etch-stop layer (~0.1 $\mu$m) is preferably sandwiched between the InP layer 212 and the InP substrate 211 during the epitaxial growth. Since the HCl-based etching solution for InP has a high etching selectivity between the InP and InGaAsP ($\lambda_g \geq 1.2$ $\mu$m), the slope etching almost halts once the InGaAsP etch-stop layer is reached. Therefore, the thickness of the IP layer 212 defines the slope height "d" and the bottom surface 220 has a epitaxy-quality flatness. Depending on the slope angle, the optimal value of slope height "d" in this embodiment lies between 1 h and 2 h, where h is the mesa height.

Figure 2C:
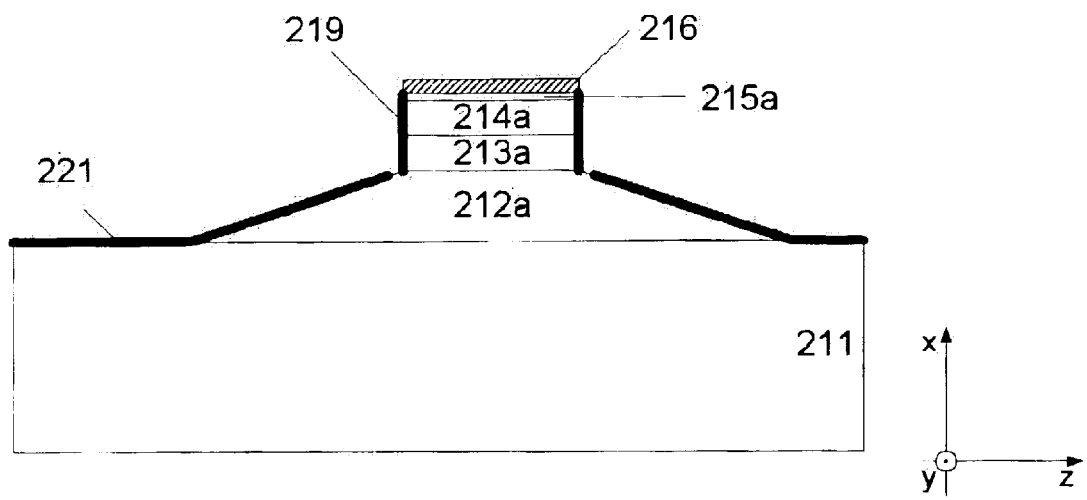

Following the etching process, it is preferably to apply a dielectric film 219, such as $SiN_x$ deposited by the plasma-enhanced chemical-vapor deposition (PECVD), on the mesa sidewall as the antireflective coating, and a highly reflective metal film 221, such as Ti/Au deposited by the evaporation process, on the slope and bottom surfaces as the reflecting mirror for lightwave confinement, as indicated in FIG. 2(c).

Figure 2D:
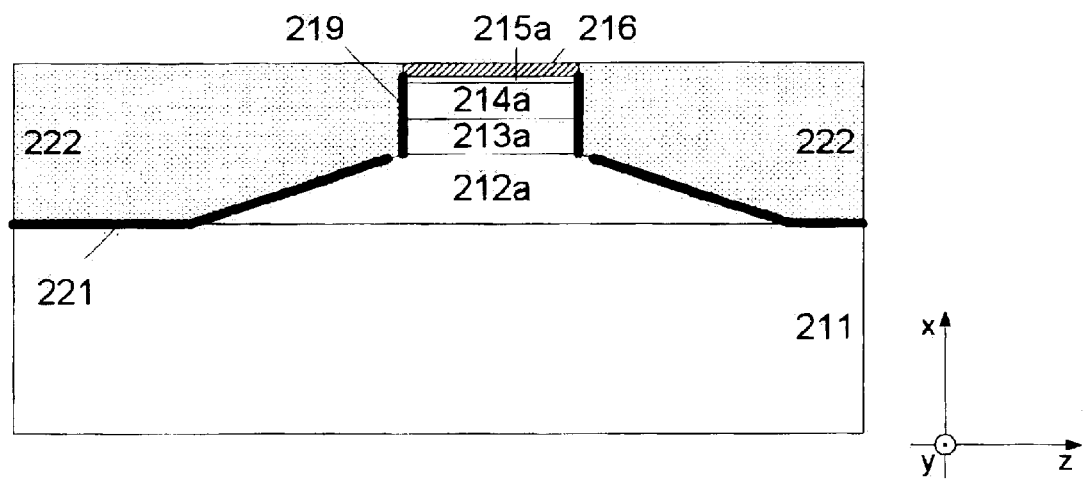

Note that the wafer surface now has a maximum step height of 2 h to 3 h. In the following, the formation of the funnel body is formed through dielectric planarization process, which can be carried out by dielectric layer deposition or spin-on process followed by the polishing and overall etch-back process. The degree of planarization (DOP) is defined as the ratio shown below:

$$DOP(\%) \equiv \frac{H_M - H_m}{H_M} \times 100\%,$$

where $H_M$ and $H_m$ represent the maximum step height on the wafer surface before and after planarization process, respectively. Completely planarized surface means that the planarization process achieves a DOP value of 100%. In practical, the DOP depends on the step height ($H_M$), step width (W), step profile and step pitch (S). Two practical examples having a DOP greater than 95% are described below and both can result in the planarized device surface as shown in FIG. 2(d), in which 222 is the planarized dielectrics.

In the first example, polymeric dielectric, such as Benzocyclobutene (BCB) provided by DOW Chemical Corp., is spun onto the wafer surface and then thermally cured for solidifying. A general rule for spin-on polymer to achieve high DOP is to have the W as small as possible. For high-speed edge-coupled photodetector, which usually has a small active mesa area (<100 $\mu m^2$), such condition can be easily fulfilled. To achieve a high DOP value, the spin-on and curing condition is to provide a dielectric layer thickness larger than 2 times of the maximum step on the wafer surface, that is, larger than 4 h at least. The flowing nature of the polymeric dielectric results in an after-spin-on profile that has a much thinner polymer on the mesa top than on the rest of the wafer surface. By overall etch-back process, such as reactive ion etching (RIE) using $CF_4/O_2$ gas mixtures, the top of the active mesa can be revealed uniformly without exposing other semiconductor surfaces, as shown in FIG. 2(d). The 222 in this example is the etched polymeric dielectric film, which has its top substantially co-leveling with the contact metallizations on top of the active mesa. It should be mentioned that before the overall etch-back process, the polymer film may be patterned into the desired funnel shape, such as 313a, 313b, or 313c illustrated in FIG. 3, using conventional photolithographic process if the polymeric material is photosensitive, such as the Photo BCB provided by DOW Chemical Corp.

In the second example, dielectric layer, such as $SiO_x$ deposited by PECVD, is deposited onto the entire wafer surface. Due to the high-degree conformal deposition nature, the topography of the wafer surface transfers to the deposited dielectric layer surface, which has the maximum step height equal to or slightly shorter than that before deposition. Through conventional wafer polish or more precise chemical-mechanical polish, the dielectric surface is polished down to a flat plane. Typically, >99% DOP can be achieved through the polish technique. The rather flat dielectric plane enables subsequent overall etch-back to expose the active mesa tops uniformly. As in the first example, RIE with $CF_4/O_2$ gas mixtures for $SiO_x$ can well perform this overall etch-back process and derive a rather flat plane with the exposed contact metallizations on top of the active mesa levelly surrounded by the $SiO_x$.

Figure 2E:
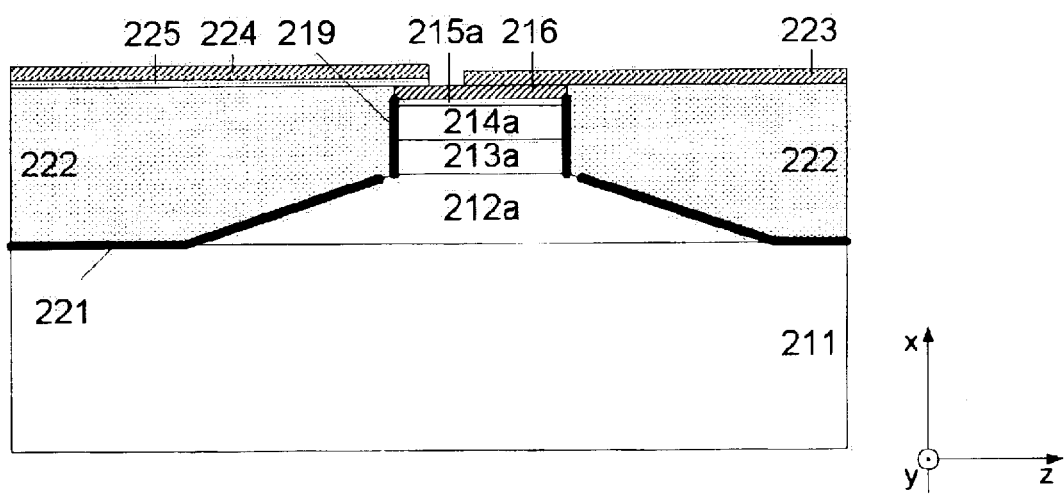
Figure 3A:
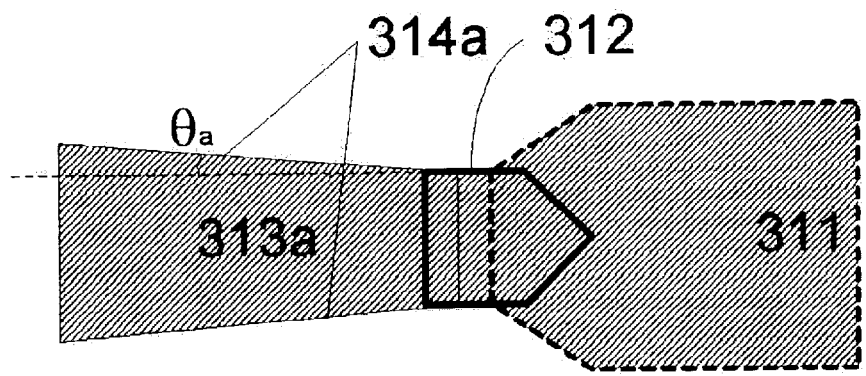
FIGS. 3(a) through 3(c) show the examples of the device top-view and each has a different funnel shape.
Figure 3B:
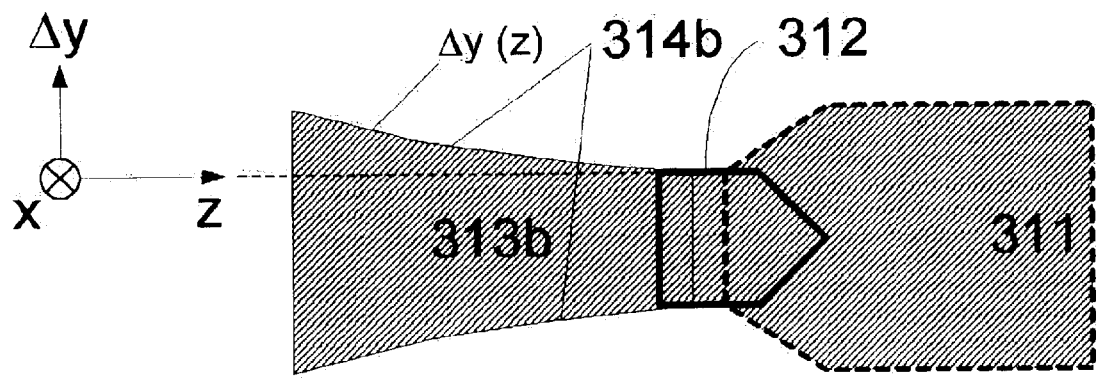
Figure 3C:
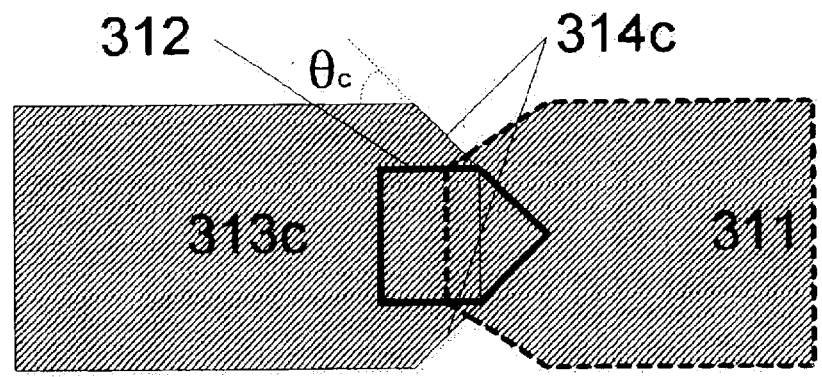

After surface planarization and the exposition of the contact metallizations 216, the contact extension 223 for remote pad is defined through conventional photolithography process and formed by metal deposition followed by lift-off process, as shown in FIG. 2(e). For defining the funnel area (if the area is not defined before overall etch-back), the funnel cap 224 is also formed through conventional photolithography and metal deposition/lift-off process. It is preferably to electrically isolate the funnel cap 224 from the contact metallizations 216 by inserting a dielectric film insulator 225, such as $SiO_x$, in between. Since in the following the funnel facets are formed by several-μm $SiO_x$ etching down to the bottom mirror 221 using the metallizations 216, 223, 224 as the etching mask, it is preferably that the topmost film of these masks is a hard material, such as Cr. However, the bottommost film of 224 should be highly reflective and, together with the highly reflective bottom mirror 221, provide effective lightwave confinement in the vertical (X-) direction. Three examples of the top view of the photodetector after funnel etching are shown in FIG. 3. The 311 represents the contact extension, the 312 defines the active mesa area, and all the 313's provide the funneling effect in the lateral (Y—) direction. Note the active mesa is defined in a pentagon shape for providing optical bending to effectively increase the absorption length. The linear edges 314a of the funnel 313a make an appropriate angle $\theta_a$ with the optical axis. The word "appropriate" means that most of the incoming light reaching the dielectric/air interfaces will be totally internal reflected. The tapered edges 314b of the funnel 313b have appropriate functions Δy(z) approaching the optical axis. The appropriate approaching function can be a parabolic taper, an S-Bend cosine taper, or the like. The end facets 314c of the funnel 313c make an appropriate angle $\theta_a$ with the optical axis and most of the light reaching the funnel end facets will be bent toward the active mesa through total internal reflection. As a reference, the critical angles for $SiO_x$/air and BCB/air interfaces are $\sin^{-1}(1/1.46)$= 43.2° and $\sin^{-1}(1/1.54)$=40.5°, respectively.

Figure 4:
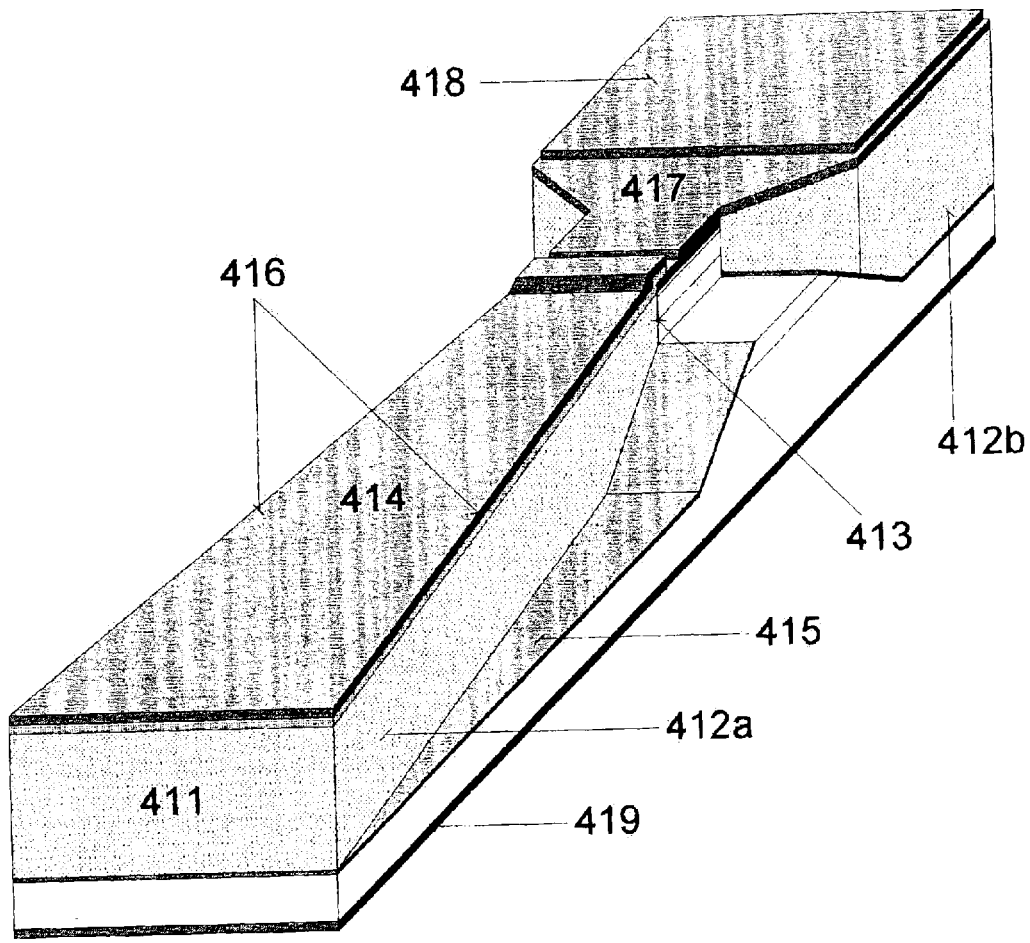
FIG. 4 is a schematic diagram of the light-funnel integrated edge-coupled photodetector described in the first embodiment.
Figure 4:
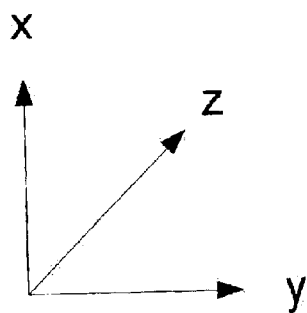

FIG. 4 is a three dimensional schematics of the light-funnel integrated edge-coupled photodetector of this embodiment. The funnel top 414 is defined as 313a. Lightwave entering the funnel through the coupling facet 411 and propagating along the dielectric tunnel 412a finally reaches the detector's aperture 413. The two highly reflective mirrors 414 and 415 provide the optical confinement through the mirror reflections in the X-direction and the two dielectric/air interfaces 416 provide the optical confinement in the Y-direction through the total internal reflections.

It is preferably that the device has a metal bonding pad 418, such as Ti/Au, for interconnect wiring. Since the metal extensions 417 lies above on the several μm thick dielectric film 412b, which can have a dielectric constant $\epsilon_r$, smaller than 4 (for example, $\epsilon_r$ of BCB ~2.6), the metal pad generates insignificant parasitic capacitance. Therefore, even the photodetector is built on a conductive substrate, the photodetector still preserves its intrinsic high-speed operation capability. It is also preferably that the wafer backside is lapped down to the thickness thinner than 200 μm and polished for n-contact metallization process. Nevertheless, the n-contact metallizations 419 are not restricted to the wafer backside. For high-frequency probing convenience or the device based on semi-insulating substrate, the n-contact metallizations can also be deposited on the front surface.

In the second embodiment, the optical funneling (in the X-direction) is realized through the resist-profile-defined, dry-etched InP slope covered first by a highly reflective metal film and then by a planarized dielectric film. Since the InP slope is formed by the resist reflow and dry etch process, the shape of the funnel has a high degree of flexibility.

Figure 5A:
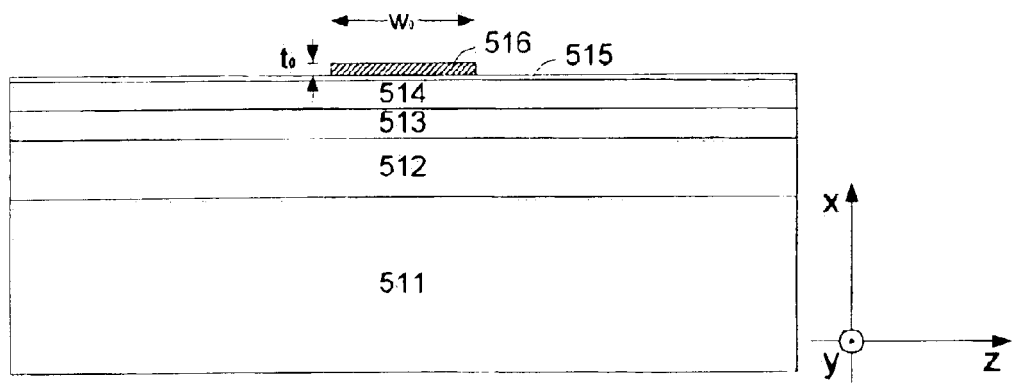
FIGS. 5(a) through 5(g) are cross-sectional views of the light-funnel-integrated edge-coupled photodetector in the process described in the second preferred embodiment of this invention.

The starting layer structure of the photodetector in this embodiment is shown in FIG. 5(a), which consists of a heavily doped n-type in P substrate 511, an epitaxially grown InP layer 512, an epitaxially grown low- or un-doped InGaAsP absorption layer 513, an epitaxially grown InGaAsP cladding layer 514, and an epitaxially grown InGaAsP contact-layer 515. More specifically, the InGaAsP absorption layer 513 have the absorption cutoff wavelength ($\lambda_g$) equal to or larger than 1.3 μm, the InGaAsP cladding layer 514 have the $\lambda_g$ smaller than that of layer 513, and the InGaAsP contact layer 515 have the $\lambda_g$ equal to or larger than that of layer 514. Such layer arrangement is to avoid the absorption occurring in the thick InGaAsP cladding layer 514 and to provide a low contact resistance between the contact metallization and the contact layer 515.

Figure 5B:
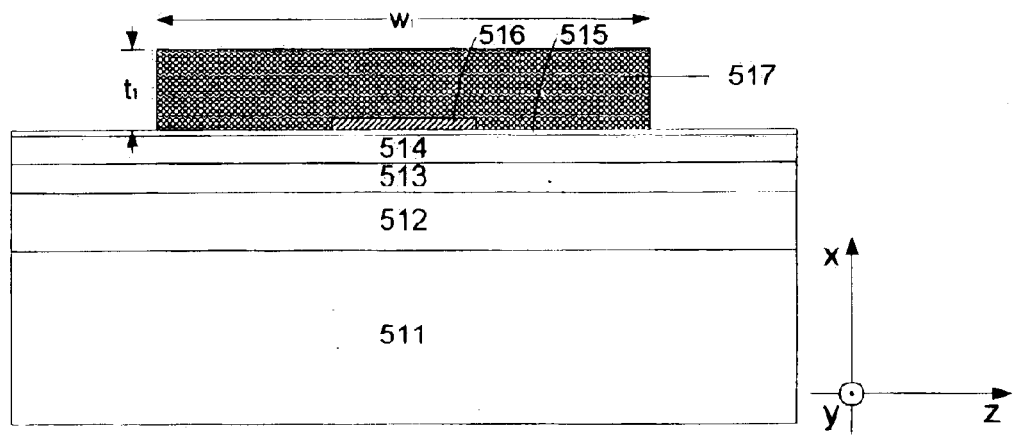
Figure 5C:
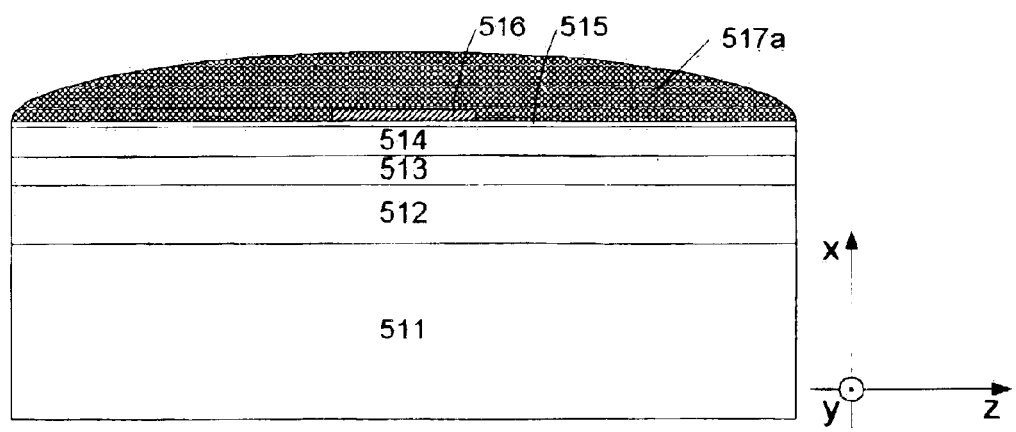
Figure 5D:
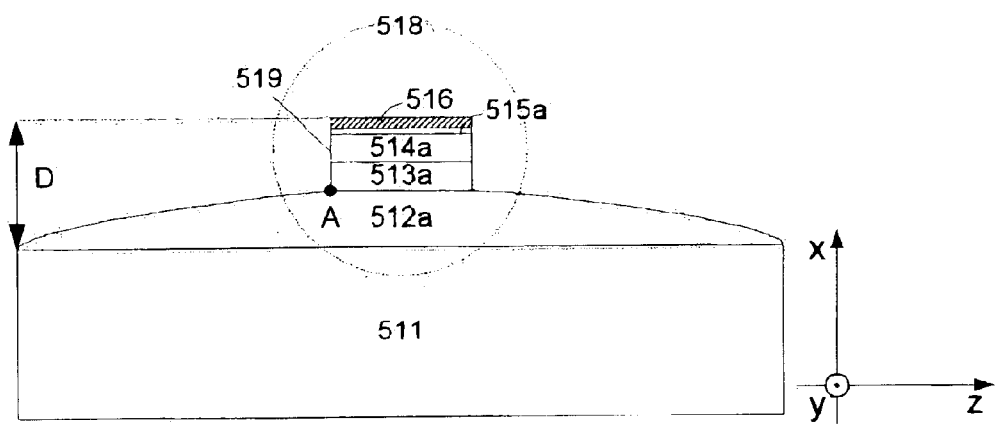

The process in this embodiment starts with the formation of the active mesa 518, as shown in the cross-sectional view FIG. 5(d). The active mesa 518 of the photodetector can either be a junction mesa or a SAD-mesa. For junction mesa, the cladding layer 514 and contact layer 515 are both p-type doped during the epitaxial process. For SAD-mesa, the cladding layer 514 and contact layer 515 are both left undoped during the epitaxial process, and are selectively p-type doped through the diffusion process. The active mesa is preferably formed by the dry etch process using, for example, $CH_4/H_2$-based or $BCl_3$-based gas mixtures to achieve the vertical side walls 519 for maximum lightwave transmission. The wafer before dry etch is prepared as shown in FIGS. 5(b) and 5(c). The active mesa area is defined by the etching mask 516, which can be dielectrics, such as $SiN_x$, or the contact metallizations, such as AuZn/Au overlaid with hard Cr films. In this embodiment, the former is utilized. Through the conventional photolithographic process, the dielectric mask is then covered by a resist strip extending in the Y-direction. Both the resist strip width $w_1$ and thickness $t_1$ are at least ten times larger than those of the dielectric mask, $w_0$ and $t_0$ for creating a smooth resist profile after thermal reflow process. The photoresist used for thermal reflow process, such as ma-P 1240 provided by Micro Resist Technology Corp. or AZ-P 4620 provided by Clariant Corp., typically has a thickness of 5–10 μm after pattern exposure and development. Appropriate heat treatment causes the resist pattern to reflow and forming a rounding surface with the curvature determined by the surface tension, as shown in FIG. 5(c).

In this embodiment, the dry etch process with $CH_4/H_2$-based or $BCl_3$-based gas mixtures is conditioned to have an etching selectivity smaller than 3:1 between the resist and the semiconductor. That is, as one part of the semiconductor is etched, no more than three parts of the photoresist are removed in the same period. The etching removes the resist layer 517a, the contact layer 515, the cladding layer 514, the absorption layer 513, and proceeds until the corner point A is reached, as shown in FIG. 5(d). The reach of point A indicates that all the absorption layer is removed except the portion 513a underneath the etching mask.516. Besides, the coupling aperture of the photodetector is now revealed. The etching may proceed a little further into the InP layer 512 without causing significant coupling loss. The etching process transfers the rounding resist profile 517a down to the semiconductor layer. The transferred curvature of 512a depends much on the etching selectivity and the etching directionality.

Unlike the first embodiment, in which the funnel bottom is formed by wet etching of the InP and the slope height is rather difficult to be exactly controlled, the funnel bottom in this embodiment is formed by dry etching, therefore the funnel height D can be reproducibly controlled and the funnel bottom can have satisfying surface quality for guiding the light. In other words, the thin InGaAsP etch-stop layer inserted between the InP layer 512 and InP substrate 511 in the first embodiment is unnecessary. The funnel height D in this embodiment is controlled to be 2 h–3 h, similar to the first embodiment. However, with proper design, the funnel height in this embodiment can be increased to 10 h or higher for greatly enlarging the coupling aperture.

Figure 5E:
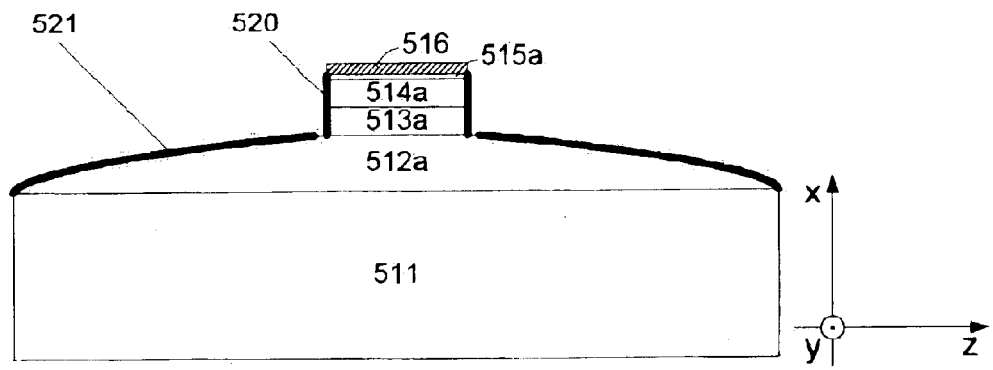

Following the etching process, it is preferably to apply a dielectric film 520, such as $SiN_x$ deposited by PECVD, on the mesa sidewall as the antireflective coating, and a highly reflective metal film 521, such as Ti/Au deposited by the evaporation process, on the funnel bottom surface as the reflecting mirror for lightwave confinement, as indicated in FIG. 5(e).

Figure 5F:
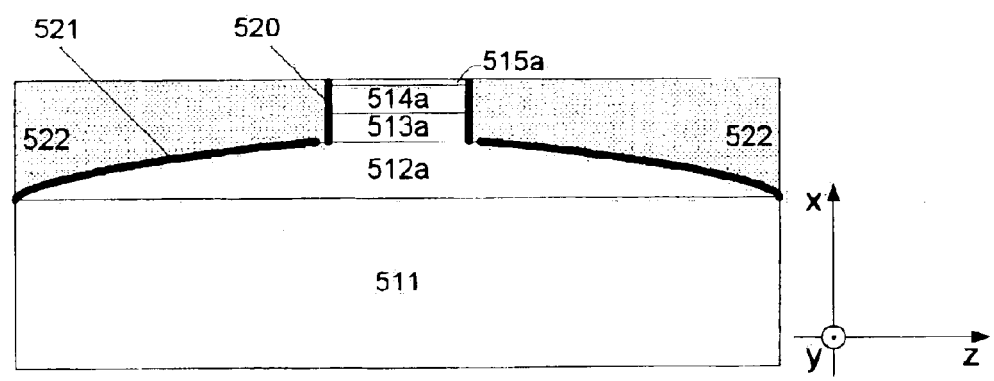

The wafer surface now has a maximum step height (funnel height) of 2 h to 3 h. In the following, the formation of the funnel body is formed through dielectric planarization process, which can be performed by dielectric layer deposition or spin-on process followed by the polishing and overall etch-back process. Two practical examples having a DOP greater than 95% are described below and both can result in the planarized device surface as shown in FIG. 5(f), in which 522 is the planarized dielectrics.

In the first example, polymeric dielectric, such as Benzocyclobutene (BCB) provided by DOW Chemical Corp., is spun onto the wafer surface and then thermally cured for solidifying. A general rule for spin-on polymer to achieve high DOP is to have the W as small as possible. For high-speed edge-coupled photodetector, which usually has a small active mesa area, such condition can be easily fulfilled. To achieve a high DOP value, the spin-on and curing condition is to provide a dielectric layer thickness larger than 2 times of the maximum step on the wafer surface, that is, larger than 4 h at least. The flowing nature of the polymeric dielectric results in an after-spin-on profile that has a much thinner polymer on the mesa top than on the rest of the wafer surface. By the overall etch-back process, such as RIE using $CF_4/O_2$ gas mixtures, the top of the active mesa can be revealed uniformly without exposing other semiconductor surfaces, as shown in FIG. 5(f). The 522 in this example is the etched polymeric dielectric film, which has its top substantially co-leveling with the contact metallizations on top of the active mesa. It should be mentioned that before the overall etch-back process, the polymer film may be patterned into the desired funnel shape, such as 313a, 313b, or 313c illustrated in FIG. 3, using conventional photolithographic process if the polymeric material is photosensitive, such as the Photo BCB provided by DOW Chemical Corp.

In the second example, dielectric layer, such as $SiO_x$ deposited by PECVD, is deposited onto the entire wafer surface. Due to a high-degree conformal deposition nature, the topography of the wafer surface transfers to the deposited dielectric layer surface, which has the maximum step height equal to or slightly shorter than that before deposition. Through conventional wafer polish or more precise chemical-mechanical polish, the dielectric surface is polished down to a flat plane. Typically, >99% DOP can be achieved through the polish technique. The rather flat dielectric plane enables subsequent overall etch-back to expose the active mesa tops uniformly. As in the first example, RIE using $CF_4/O_2$ gas mixtures for $SiO_x$ can well perform this overall etch-back process and derive a rather flat plane with the active mesa tops exposed uniformly and co-levelly surrounded by $SiO_x$.

Figure 5G:
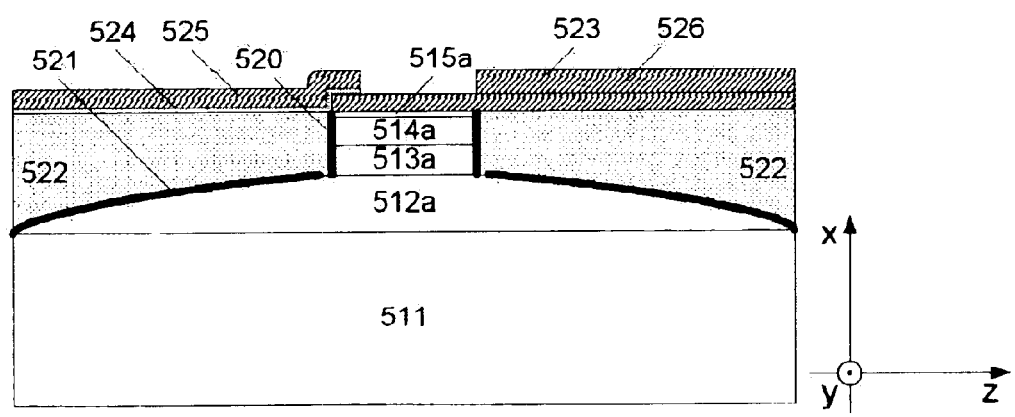

After the surface planarization and the exposition of the contact layer 515a, the p-contact and its extension 523 is defined through conventional photolithography process and formed by metal deposition followed by lift-off process, as shown in FIG. 5(g). For defining the funnel area (if the area is not defined before overall etch-back), the funnel cap 525 is also formed through conventional photolithography and metal deposition/lift-off process. It is preferably to electrically isolate the funnel cap 525 from the p-contact metallizations 523 by inserting a dielectric film insulator 524, such as $SiO_x$, in between. Since in the following the funnel facets are formed by several-$\mu$m $SiO_x$ etching down to the bottom mirror 521 using the metallizations 523 and 525 as the etching mask, it is preferably that the topmost film of these masks is a hard material, such as Cr. However, the bottommost film of 525 should be highly reflective and, together with the highly reflective bottom mirror 521, provide effective lightwave confinement in the vertical (X-) direction. Three examples of the top view of the photodetector after funnel etching are shown in FIG. 3. The 311 represents the contact extension, the 312 defines the active mesa area, and all the 313's provide the funneling effect in the lateral (Y—) direction. The linear edges 314a of the funnel 313a make an appropriate angle $\theta_c$ with the optical axis and most of the incoming light reaching the dielectric/air interfaces will be totally internal reflected. The tapered edges 314b of the funnel 313b have appropriate functions $\Delta y(z)$ approaching the optical axis. The appropriate approaching function can be a parabolic taper, an S-Bend cosine taper, or the like. The end facets 314c of the funnel 313c make an appropriate angle $\theta_a$ with the optical axis and most of the light reaching the funnel end facets will be bent toward the active mesa through total internal reflection.

Figure 6:
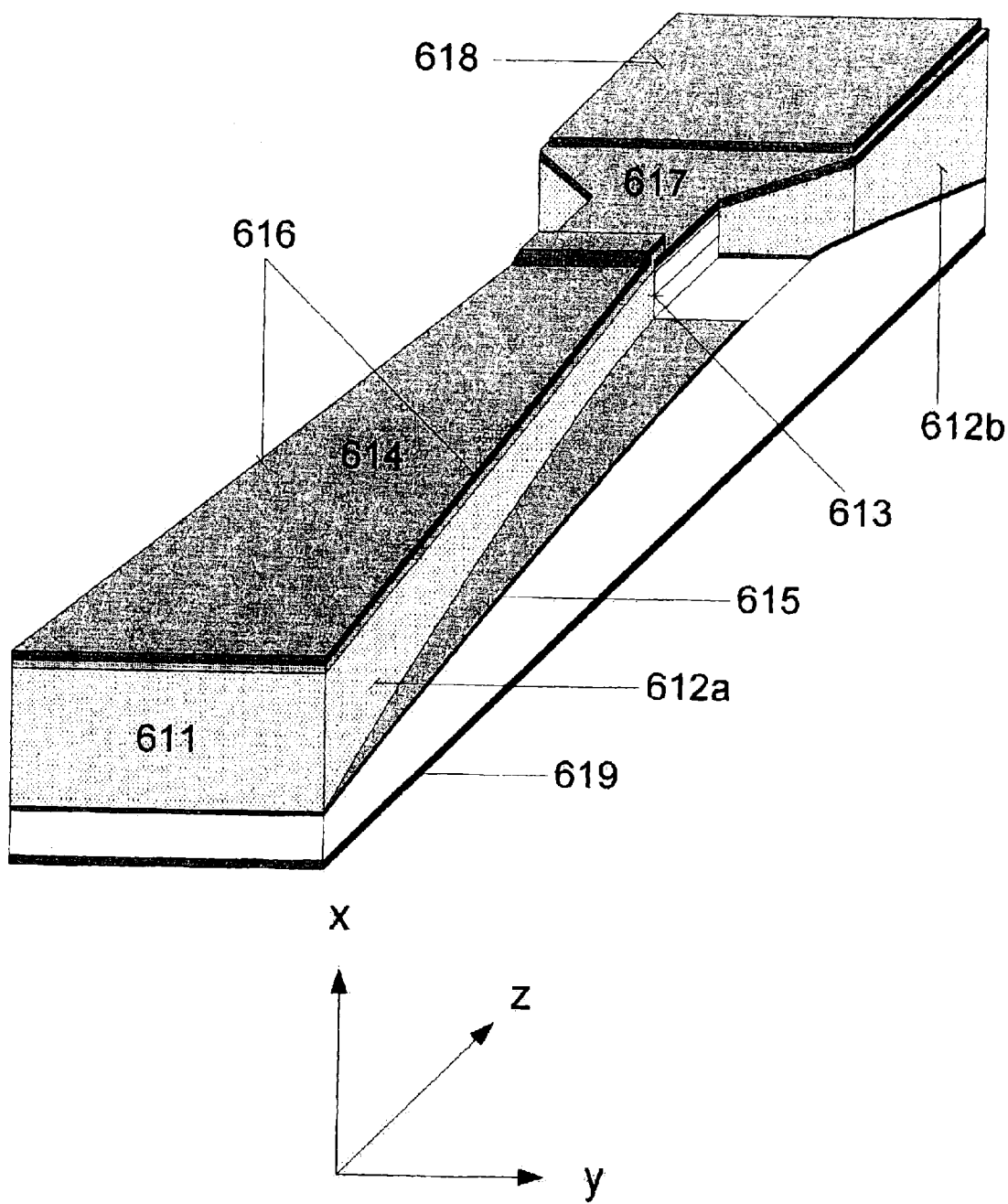
FIG. 6 is a schematic diagram of the light-funnel integrated edge-coupled photodetector described in the second embodiment.

FIG. 6 is a three dimensional schematics of the light-funnel integrated edge-coupled photodetector of this embodiment. The funnel top 614 is defined as 313a. Lightwave entering the funnel through the coupling facet 611 and propagating along the tapering dielectric waveguide 612a finally reaches the detector's aperture 613. The two highly reflective mirrors 614 and 615 provide the optical confinement in the X-direction within the dielectric waveguide through the mirror reflections and the two dielectric/air interfaces 616 provide the optical confinement in the Y-direction within the dielectric waveguide through the total internal reflections. It is preferably that the device has a metal bonding pad 619, such as Ti/Au, for interconnect wiring. Since the p-contact and its extension 617 lies above on the several $\mu$m thick dielectric film 612b, which can have a dielectric constant $\epsilon_r$ smaller than 4 (for example, $\epsilon_r$ of BCB ~2.6), the metal pad generates insignificant parasitic capacitance. Therefore, even the photodetector is built on a conductive substrate, the photodetector still preserves its intrinsic high-speed operation capability. It is also preferably that the wafer backside is lapped down to the thickness thinner than 200 $\mu$m and polished for n-contact metallization process. Nevertheless, the n-contact metallizations 619 are not restricted to the wafer backside. For high-frequency probing convenience or the device based on semi-insulating substrate, the n-contact metallizations can also be deposited on the front surface.

The application of this invention has been described using two preferred embodiments. However, it is to be emphasized that the scope of the invention is not limited to these disclosed embodiments. To the contrary, it is intended to cover various modifications and similar arrangements known to those skilled in the art. The scope of the claims, therefore, should be broadly interpreted to encompass all such modifications and similar arrangements.

What is claimed is:

1. Method for improving a high-speed edge-coupled photodetector based on the compound semiconductor substrate comprising the following processes:

a) forming a coupling facet of said photodetector by the etching process;

b) providing said coupling facet with edges of an absorption layer and of layers above;

c) forming a chemically etched, crystallographically defined semiconductor slope right in front of and below said coupling facet;

d) coating said coupling facet with an antireflective dielectric film;

e) covering said semiconductor slope with a highly reflective metal film and a thick dielectric layer followed by a planarization process;

f) providing an optical funneling effect in the vertical direction with said thick dielectric layer together with its sloping bottom and planarized top; and g) forming the top view of said planarized dielectric layer into a proper funnel shape so as to provide said optical funneling effect in the lateral direction.

2. The method of claim 1, wherein said coupling facet further comprises an edge of layers which is below the absorption layer and provides optical guiding.

3. The method of claim 1, wherein said semiconductor slope has a rising angle smaller than 45°.

4. The method of claim 1, wherein said planarization process for said thick dielectric layer is a polymer spin-on process, followed by thermal curing and overall etching-back to uniformly expose the top of said photodetector.

5. The method of claim 1, wherein said planarization process for said thick dielectric layer is a conformal deposition process, followed by dielectric polishing and overall etching-back to uniformly expose the top of said photodetector.

6. The method of claim 1, wherein said planarized dielectric layer has its top covered by highly reflective metal film or left uncovered.

7. Method for improving a high-speed edge-coupled photodetector based on the compound semiconductor substrate comprising the following processes:

a) Forming a coupling facet of said photodetector by the etching process;

b) Providing said coupling facet with edges of an absorption layer and of layers above;

c) Forming a dry etched, resist-profile-defined semiconductor slope right in front of and below said coupling facet;

d) Forming said semiconductor slope to have a tapering profile with adequate curve functions;

e) Coating said coupling facet with an antireflective dielectric film;

f) Covering said semiconductor slope with a highly reflective metal film and a thick dielectric layer followed by a planarization process, g) Providing an optical funneling effect in the vertical direction with said thick dielectric layer together with its tapered bottom and planarized top; and h) Forming the top view of said planarized dielectric layer into a proper funnel shape so as to provide said optical funneling effect in the lateral direction.

8. The method of claim 7, wherein said coupling facet further comprises an edge of layers which is below the absorption layer and provides optical guiding.

9. The method of claim 7, wherein said planarization process for said thick dielectric layer is a polymer spin-on process, followed by thermal curing and overall etching-back to uniformly expose the top of said photodetector.

10. The method of claim 7, wherein said planarization process for said thick dielectric layer is a conformal deposition process, followed by dielectric polishing and overall etching-back to uniformly expose the top of said photodetector.

11. The method of claim 7, wherein said planarized dielectric layer has its top covered by highly reflective metal film or left uncovered.

* * * * *